United States Patent
Shubin

(10) Patent No.: US 11,152,941 B2
(45) Date of Patent: Oct. 19, 2021

(54) HIGH-VOLTAGE VOLTAGE LEVEL CONVERTER

(71) Applicant: Vladimir Vladimirovich Shubin, Novosibirsk (RU)

(72) Inventor: Vladimir Vladimirovich Shubin, Novosibirsk (RU)

( * ) Notice: Subject to any disclaimer, the term of this patent is extended or adjusted under 35 U.S.C. 154(b) by 0 days.

(21) Appl. No.: 16/966,723

(22) PCT Filed: Dec. 18, 2019

(86) PCT No.: PCT/RU2019/050248
§ 371 (c)(1),
(2) Date: Jul. 31, 2020

(87) PCT Pub. No.: WO2020/185116
PCT Pub. Date: Sep. 17, 2020

(65) Prior Publication Data
US 2021/0143734 A1    May 13, 2021

(30) Foreign Application Priority Data

Mar. 14, 2019 (RU) .................................. 2019107414

(51) Int. Cl.
*H03K 3/37* (2006.01)
*H03K 19/0948* (2006.01)
*H03K 3/037* (2006.01)
*H03K 19/00* (2006.01)

(52) U.S. Cl.
CPC ......... *H03K 19/0948* (2013.01); *H03K 3/037* (2013.01); *H03K 19/00* (2013.01); *H03K 19/0013* (2013.01); *H03K 19/0027* (2013.01)

(58) Field of Classification Search
CPC .......... H03K 3/037; H03K 19/018521; H03K 19/018528; H03K 19/0948
USPC ........................................... 327/333
See application file for complete search history.

(56) References Cited

U.S. PATENT DOCUMENTS

| | | | | |
|---|---|---|---|---|
| 4,978,870 A | * | 12/1990 | Chen ............... | H03K 3/356104 326/68 |
| 5,243,236 A | * | 9/1993 | McDaniel ........ | H03K 3/356017 326/68 |
| 6,099,100 A | | 8/2000 | Lee | |
| 9,755,621 B1 | * | 9/2017 | Sinha ............... | H03K 3/356113 |
| 2017/0187360 A1 | * | 6/2017 | Uesugi ................ | G09G 3/3696 |

FOREIGN PATENT DOCUMENTS

| | | |
|---|---|---|
| RU | 2231903 C2 | 6/2004 |
| RU | 2457601 C1 | 7/2012 |
| RU | 2604054 C1 | 12/2016 |

* cited by examiner

*Primary Examiner* — Gary L Laxton
(74) *Attorney, Agent, or Firm* — Muncy, Geissler, Olds & Lowe, P.C.

(57) ABSTRACT

The invention relates to a high-voltage voltage level converter for matching of the components of electronic systems containing multiple power sources. In particular, the high-voltage voltage level converter includes seven P-type field-effect transistors and seven N-type field-effect transistors, the signal input terminal (IN), the inputs of reference source voltages ⅔VDD and (⅓VDD), inverted output, high-level source voltage terminals (VCC) and (VDD), and low-level source voltage terminal (VSS).

1 Claim, 1 Drawing Sheet

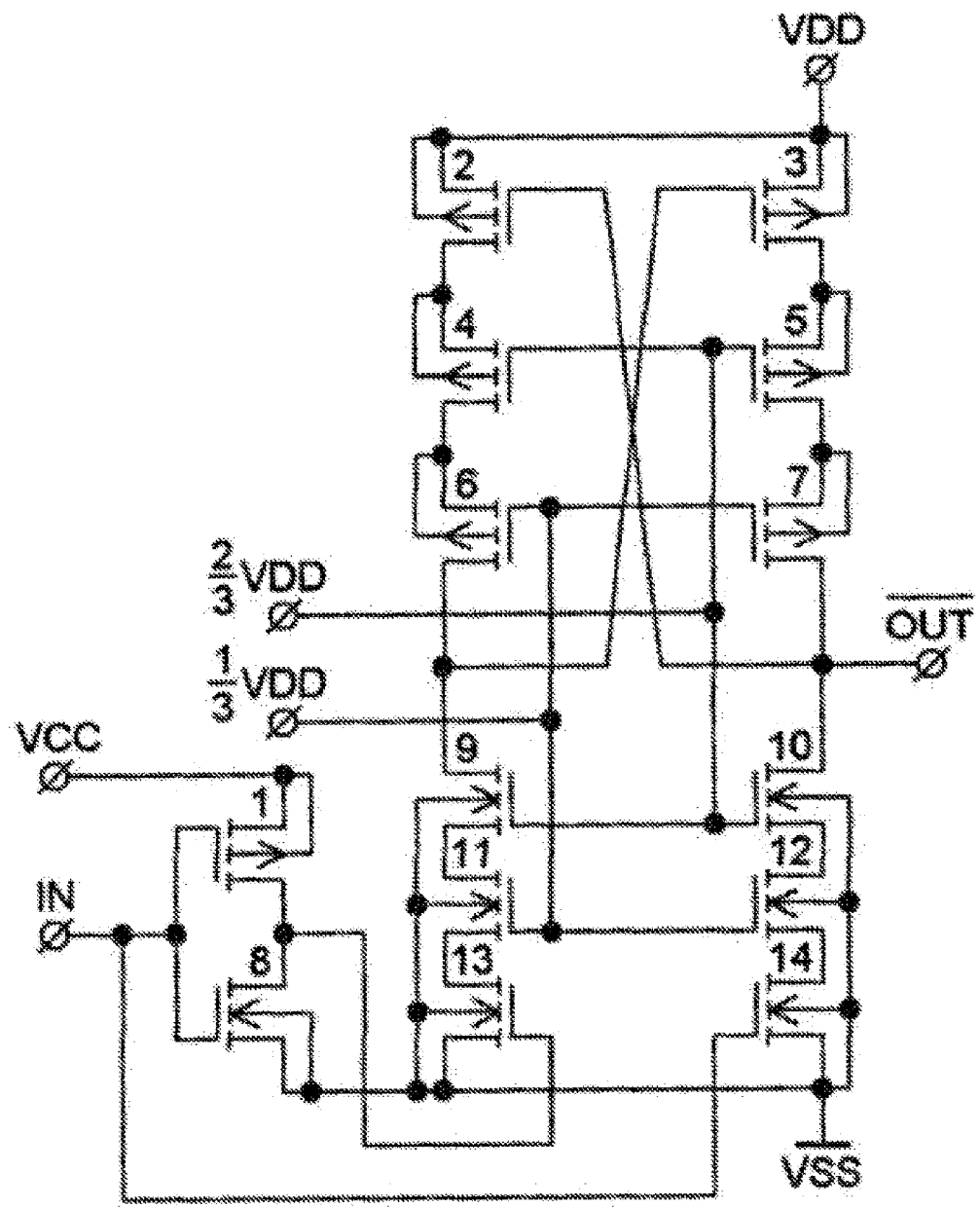

HIGH-VOLTAGE VOLTAGE LEVEL CONVERTER

This nonprovisional application is a continuation of International Application No. PCT/RU/-50248, which was filed on Dec. 18, 2019, and which claims priority to Russian Patent Application No. 2019107414, which was filed in Russia on Mar. 14, 2019, and which are both herein incorporated by reference.

TECHNICAL AREA

The proposed invention relates to digital computer hardware and can be used for matching of circuits that have different voltage levels of power sources and/or of internal signals.

PRIOR KNOWLEDGE

A CMOS digital level shift circuit is known [1]. This device is designed to convert the voltage level of a low-amplitude input signal into an output signal with a high-amplitude voltage level (for example, when matching TTL and CMOS logic elements). The disadvantage of the above mentioned circuit is low response rate. The low response rate of the circuit is caused by delay of appearance of the low-level voltage on the gates of the P-type transistors of the latch that provide the feedback. This delay is caused by discharge of node capacities of the drains and sources of N-type and P-type transistors connected serially between the source of low-level voltage VSS and the gates of the P-type transistors of the latch.

Engineering Problem

The purpose of the proposed invention is to increase the response speed of the Digital CMOS level shift circuit.

PROBLEM SOLUTION

The formulated problem is solved by introducing in the Digital CMOS level shift circuit that contains P-type field-effect transistors (FETs) numbered from the first to seventh and N-type FETs numbered from the eighth to fourteenth, the signal input terminal IN connected to the gates of the first, eighth and fourteenth transistors, high-level source voltage terminal VCC connected to the source and substrate of the first transistor, high-level source voltage terminal VDD connected to the sources and substrates of the second and third transistors, low-level source voltage terminal VSS connected to the sources of the eighth, thirteenth and fourteenth transistors and the substrates of the transistors numbered from the eighth to the fourteenth, inverted output $\overline{OUT}$ connected to the drains of the seventh and tenth transistors, input of reference source voltage ⅔ VDD connected to the gates of the fourth, fifth, ninth and tenth transistors, input of reference source voltage ⅓ VDD connected to the gates of the sixth, seventh, eleventh and twelfth transistors, whereas the drains of the first and eighth transistors are connected to the gate of the thirteenth transistor, the drain of the second transistor is connected to the source and substrate of the fourth transistor which drain is connected to the source and substrate of the sixth transistor, the drain of the sixth transistor is connected to the drain of the ninth transistor, and the source of the ninth transistor is connected to the drain of the eleventh transistor which source is connected to the drain of the thirteenth transistor, and the source of the tenth transistor is connected to the drain of the twelfth transistor which source is connected to the drain of the fourteenth transistor, the gate of the second transistor is connected to the drains of the seventh and tenth transistors, and the gate of the third transistor is connected to the drains of the sixth and ninth transistors.

POSITIVE EFFECTS OF THE INVENTION

Therefore, in the proposed scheme of High-voltage voltage level converter, due to distinctions from the known device described above, P-type transistors numbered from the fourth to the seventh are excluded from the chains of N-type and P-type transistors connected in series between the low-level source voltage VSS and the gates of the second and third P-type transistors of the latch. Therefore, the sequential chains of node capacitances are shortened in quantity as compared to the CMOS digital level shift circuit and, consequently, the total discharge time of these nodal capacitances is reduced. Hence, the low-level voltage reaches faster the gates of the second and third transistors; as a result, the response rate of the entire circuit of the High-voltage voltage level converter increases.

BRIEF DESCRIPTION OF THE DRAWINGS

The drawing shows the circuit diagram of the proposed High-voltage voltage level converter.

DETAIL DESCRIPTION

The proposed High-voltage voltage level converter contains P-type field-effect transistors numbered from one to seven (1-7) and N-type field-effect transistors numbered from eighth to fourteenth (8-14), signal input terminal IN connected to the gates of the first (1), eighth (8) and fourteenth (14) transistors, high-level source voltage terminal VCC connected to the source and the substrate of the first transistor (1), high-level source voltage terminal VDD connected to the sources and substrates of the second (2) and third (3) transistors, low-level source voltage terminal VSS connected to the sources of eighth (8), thirteenth (13) and fourteenth (14) transistors and to the substrates of the transistors numbered from the eighth to the fourteenth (8-14), inverted output $\overline{OUT}$ connected to the drains of the seventh (7) and tenth (10) transistors, input of reference source voltage ⅔ VDD connected to the gates of the fourth (4), fifth (5), ninth (9) and tenth (10) transistors, input of reference source voltage ⅓ VDD connected to the gates of the sixth (6), seventh (7), eleventh (11) and twelfth (12) transistors. Whereas the drains of the first (1) and eighth (8) transistors are connected to the gate of the thirteenth (13), the drain of the second (2) transistor is connected to the source and the substrate of the fourth (4) transistor which drain is connected to the source and substrate of the sixth (6) transistor, the drain of the sixth (6) transistor is connected to the drain of the ninth (9) transistor, and the drain of the sixth (6) transistor is connected to the drain of the ninth (9) transistor, and the drain of the third (3) transistor is connected to the source and the substrate of the fifth (5) transistor which drain is connected to the source and substrate of the seventh (7) transistor, the source of the ninth (9) transistor is connected to the drain of the eleventh (11) transistor which source is connected to the drain of the thirteenth (13) transistor, and the source of the tenth (10) transistor is connected to the drain of the twelfth (12) transistor which source is connected to the drain of the fourteenth (14) transistor, the gate of the second (2) transistor is connected to the drains of the seventh (7) and tenth (10) transistors, and the gate of the third (3) transistor is connected to the drains of the sixth (6) and ninth (9) transistors.

The proposed High-voltage voltage level converter is a digital logic device designed to convert the input signal with amplitude changing from low-level voltage VSS ("0") to the voltage of logical unit "1*" (VCC) into the output signal with amplitude changing from low-level voltage VSS ("0") to the voltage of logical unit "1" corresponding to the high-level supply voltage VDD, and works as follows.

Initial state. Low-level voltage corresponding to the logical "0" is applied to the source voltage terminal VSS and to the input terminal IN; high-level voltage corresponding to logical "1*" for the input inverter built on FETs 1 and 8 is applied to the terminal of the first source of high-level voltage VCC; and high-level voltage corresponding to logical "1" of the High-voltage voltage level converter is applied to the terminal of the second source of high-level voltage VDD. Besides, voltage corresponding to two-thirds of the high-level voltage VDD is set at the input of the source of reference voltage ⅔ VDD, and voltage corresponding to one-third of the high-level voltage VDD is set at the input of the source of reference voltage ⅓ VDD; as a consequence of this, the N-type and P-type transistors, which gates receive these reference voltages, are always open. Since the input terminal IN is connected to the gates of P-type transistor 1 and N-type transistors 8 and 14, and its voltage is set to the low-level voltage VSS ("0"), therefore, P-type transistor 1 is open, and N-type transistors 8 and 14 are closed. Therefore, high-level voltage VCC ("1*") through the open transistor 1 is applied to the gate of transistor 13, consequently N-type transistor 13 is open. Since high-level voltage ⅓ VDD is applied to the gates of N-type transistors 11 and 12 and P-type transistors 6 and 7, and high-level voltage ⅔ VDD is applied to the gates of N-type transistors 9 and 10 and P-type transistors 4 and 5, therefore transistors 4-7 and 9-12 are open. Besides, as a result of the previous regenerative cycle, P-type transistor 2 is closed, and P-type transistor 3 is open. Therefore, high-level voltage VDD ("1") is set on the inverted output $\overline{\text{OUT}}$ of the High-voltage voltage level converter through open transistors 3, 5 and 7.

In the mode of converting high-level voltage of logical unit "1*" (VCC) into low-level voltage VSS ("0"), voltage of logical unit "1*" (VCC) is applied to input terminal IN and, consequently, to the gates of P-type transistor 1 and N-type transistors 8 and 14. Therefore, transistor 1 closes, while transistors 8 and 14 open, and low-level voltage VSS ("0") is applied through transistors 8 and 14 to the gate of transistor 13 and to the source of N-type transistor 12; as a result, N-type transistor 13 closes, and low-level voltage VSS ("0") is applied through the open N-type transistors 12 and 10 to the gate of transistor 2 and to the inverse output $\overline{\text{OUT}}$ of the High-voltage voltage level converter. Therefore, transistor 2 opens, and high-level voltage VDD ("1") is applied through the open P-type transistors 2, 4 and 6 to the gate of P-type transistor 3, as a result of which transistor 3 closes, the latch is set to storage mode, and low-level voltage VSS ("0") is set on the inverted output $\overline{\text{OUT}}$.

During transition of the High-voltage voltage level converter to the initial state and to the mode of formation of high-level voltage VDD ("1") on the inverted output $\overline{\text{OUT}}$, low-level voltage VSS ("0") is applied to input IN, and, consequently, to the gates of P-type transistor 1 and N-type transistors 8 and 14. Therefore, transistor 1 opens, and transistors 8 and 14 close. High-level voltage VCC ("1*") is applied to the gate of transistor 13 through the open transistor 1; as a consequence of this, it opens, and low-level voltage VSS ("0") is applied to the source of transistor 11 through it. Since N-type transistors 9 and 11 are open, low-level voltage VSS ("0") is applied to the gate of P-type transistor 3, and transistor 3 opens. Therefore, high-level voltage VDD ("1") through the open P-type transistors 3, 5 and 7 is applied to the inverted output $\overline{\text{OUT}}$ and to the gate of P-type transistor 2, as a result of which transistor 2 closes, the latch is set to storage mode, and the circuit of the High-voltage voltage level converter passes to the initial state.

Therefore, in the proposed scheme of High-voltage voltage level converter, as opposed to the CMOS digital level shift circuit, P-type transistors numbered from the fourth to the seventh are excluded from the chains of N-type and P-type transistors serially connected between the source of low-level voltage VSS and the gates of P-type transistors 2 and 3 of the latch. Therefore, the sequential chains of node capacitances are shortened in quantity as compared to the CMOS digital level shift circuit and, consequently, the total discharge time of these nodal capacitances is reduced. Hence, the low-level voltage reaches faster the gates of transistors 2 and 3; as a result, the response rate of the entire circuit of the High-voltage voltage level converter increases

PATENT LITERATURE

1. CMOS Digital Level Shift Circuit: U.S. Pat. No. 6,099,100A/Won Kee Lee; assignee LG Semicon Co. Ltd.— 8.08.2008

The invention claimed is:
1. High-voltage voltage level converter containing:
P-type field-effect transistors (FETs) numbered from first to seventh and N-type FETs numbered from eighth to fourteenth;
signal input terminal (IN) connected to gates of the first, eighth and fourteenth transistors;
a high-level voltage power terminal (VDD) connected to source and substrate of the first transistor;
a high-level voltage power terminal (VDD) connected to sources and substrates of the second and third transistors;
a low-level voltage power terminal (VSS) connected to sources of the eighth, thirteenth and fourteenth transistors and substrates of transistors numbered from the eighth to the fourteenth;
an inverted output ($\overline{\text{OUT}}$) connected to drains of the seventh and tenth transistors, an input of reference source voltage (⅔VDD) connected to gates of the fourth, fifth, ninth and tenth transistors;
an input of reference source voltage (⅓VDD) connected to gates of the sixth, seventh, eleventh and twelfth transistors,
wherein drains of the first and eighth transistors are connected to a gate of the thirteenth transistor,
a drain of the second transistor is connected to a source and a substrate of the fourth transistor, a drain of which is connected to a source and a substrate of the sixth transistor,
a drain of the sixth transistor is connected to a drain of the ninth transistor,
a drain of the third transistor is connected to a source and a substrate of the fifth transistor, a drain of which is connected to a source and a substrate of the seventh transistor, a source of the ninth transistor is connected to a drain of the eleventh transistor, a source of which is connected to a drain of the thirteenth transistor, a source of the tenth transistor is connected to a drain of the twelfth transistor, a source of which is connected to a drain of the fourteenth transistor, and wherein a gate of the second transistor is connected to drains of the seventh and tenth transistors, which connected to the inverted output ($\overline{OUT}$), and a gate of the third transistor is connected to drains of the sixth and ninth transistors OUT.

\* \* \* \* \*